(12) United States Patent
Amosov

(10) Patent No.: US 7,972,439 B2
(45) Date of Patent: Jul. 5, 2011

(54) METHOD OF GROWING SINGLE CRYSTALS FROM MELT

(75) Inventor: Vladimir Iljich Amosov, Moscow (RU)

(73) Assignees: Vladimir Iljich Amosov, Moscow (RU); Bernard Pusch, Berlin (DE)

( * ) Notice: Subject to any disclaimer, the term of this patent is extended or adjusted under 35 U.S.C. 154(b) by 490 days.

(21) Appl. No.: 11/658,217

(22) PCT Filed: Mar. 24, 2005

(86) PCT No.: PCT/EP2005/003239
§ 371 (c)(1), (2), (4) Date: Jan. 23, 2007

(87) PCT Pub. No.: WO2006/012924
PCT Pub. Date: Feb. 9, 2006

(65) Prior Publication Data
US 2008/0282968 A1    Nov. 20, 2008

(30) Foreign Application Priority Data

Aug. 5, 2004  (RU) ............................... 2004123875
Aug. 5, 2004  (RU) ............................... 2004123876

(51) Int. Cl.
*C30B 11/00* (2006.01)

(52) U.S. Cl. ............... 117/73; 117/81; 117/83; 117/200

(58) Field of Classification Search .................... 117/73, 117/81, 83, 200
See application file for complete search history.

(56) References Cited

U.S. PATENT DOCUMENTS

| | | | | |
|---|---|---|---|---|
| 5,132,091 A | * | 7/1992 | Azad | 117/217 |
| 5,961,720 A | * | 10/1999 | Imaeda et al. | 117/214 |
| 6,036,775 A | * | 3/2000 | Imaeda et al. | 117/214 |
| 7,014,707 B2 | * | 3/2006 | Amemiya | 117/81 |
| 2006/0016387 A1 | * | 1/2006 | Yokoyama et al. | 117/84 |

* cited by examiner

*Primary Examiner* — Robert M Kunemund
(74) *Attorney, Agent, or Firm* — Henry M. Feiereisen; Ursula B. Day

(57) ABSTRACT

In a method of growing single crystals from melt, the starting material is fused and a single crystal is pulled by crystallization of the melt on a seed crystal with controlled removal of the crystallization heat. Independent heating sources constituting thermal zones are used and constitute two equal-sized coaxial thermal zones which make up a united thermal area for the melt and the single crystal being grown and are separated by the melt starting material being carried out by heating the upper thermal zone with a heater 30-50% of power required for obtaining the melt, until in the upper thermal zone maximum temperature is reached The remaining power is supplied to the lower thermal zone to a lower heater with maintaining constant temperature of the upper thermal zone till complete melting of the charge. Single crystal enlargement and growing is conducted with controlled lowering of temperature in the upper thermal zone.

2 Claims, No Drawings

METHOD OF GROWING SINGLE CRYSTALS FROM MELT

The present invention relates to the technology of growing single crystals from melts on a seed crystal.

The technical problem to be solved by the present invention is to provide a universal method of growing single crystals of various chemical composition, for example, of $A_2B_6$ and $A_2B_5$ type, and also single crystals of refractory oxides, such as sapphire.

Monocrystalline materials of $A_2B_5$ and $A_2B_6$ type and those based on oxides are used as optical materials. The development of instrumentation on the basis of these materials substantially adds to the demand for them and raises the quality, efficiency and cost price requirements.

Known in the art is a method of growing single crystals of leucosapphire from melt on a seed crystal, which comprises the presence of temperature gradients ranging within 0.05 to 1.0° C./mm and the ratio of the deviation of vertical temperature gradients to radial ones >1, vacuum melting of the starting charge, introducing a seed crystal and pulling a single crystal from the cooling melt (see RU 2056463, C30B 29/20, publ. 1996).

The essence of the method consists in determining the seed crystal introducing temperature from the appearance of a 1-3 mm single crystal on the surface of the melt being cooled and in growing a single crystal with the pulling rate being varied stepwise from 0.1 mm/hr at the beginning of crystallization to 1.0 mm/hr in the final stage of the process with simultaneous lowering of the melt temperature with a sped of 25-50° C./hr. The process of growing is terminated by cooling the obtained single crystal with the rate of 25-50° C./hr. Pulling with a small rate in the initial stage of the process makes it possible to provide formation of a regular lattice, to rule out the appearance of dislocations and blocks, and the formation of bubbles. Pulling with a 10-fold increase of the rate in the final stage provides a reduction of the process time.

This method contemplates growing a crystal from an "overcooled" melt at the crystallization front. Since the radial temperature gradient at the center of the melt, where the seed crystal is located, is always equal to zero, even a slight lowering of the heater temperature and then of the melt temperature creates an area at the crystallization front, wherein the temperature is lower than the crystallization temperature. For the removal of the crystallization heat evolving in the course of growing the crystal, in the method under discussion the crystal growth rate is lowered and thereby the amount of heat evolved during crystallization is reduced and time is provided for the heat to be removed along the crystal due to the heat conduction of the material of the crystal being grown.

This method is disadvantageous in a low performance which rules out its use in the production of large lots of single crystals.

A method is known of growing gallium arsenide single crystals from melt on a seed crystal, in which the seed crystal is brought in contact with the melt placed in a crucible under a layer of liquid flux, followed by crystallization of the entire volume of the melt with liquid encapsulation with flux (see RU 2054495, C30B 17/.00, publ. 1996). The method is intended for growing single crystals of gallium arsenide for manufacturing integrated circuit substrates. Therefore the thickness of the melt layer is selected to be equal to the thickness of the substrate. This method cannot be used for growing bulk single crystals of gallium arsenide.

A method is known of growing optical single crystals from melt by the Czochralski process with the use of three heaters (high-frequency heating of a platinum crucible with a melt, a heater for heating the crucible bottom, and a controlled active-resistance conical heater for heating the seed crystal, its holder and rod), which comprises melting down starting strongly ground oxides and growing a single crystal from melt on a rotating seed crystal, in which method growing is carried out when a thermal equilibrium has been established and a flat or slightly convex surface of the melt-crystal interface has been reached. For this purpose the entire process is conducted with additional heating of the seed crystal, the seed holder and rod to a temperature exceeding the crystal growing temperature by a value providing the ratio of IR radiation in the melt and solid phase, i.e., $\lambda_{melt}/\lambda_{crystal}=0.25$. In the stage of enlargement of the crystal being pulled heating is not carried out (see DD 290226, A5, C03B 15/22, publ. 1991).

The essence of the method consists in that a temperature field is created, with which the temperature of the seed crystal with the holder and rod is equal to the temperature $\sim T_{melt}$ of the crystal being grown. Seeding, enlargement and further growth of the crystal is based on the difference in the heat transmission of IR radiation from the crystallization front through the crystal and through the melt. Since the transmission coefficient of the crystal is greater than that of the melt, the crystal, naturally, has a somewhat lower temperature than the melt. As a result, crystal growing on the seed takes place. This thermodynamic equilibrium is maintained automatically throughout the crystal growth period by additional heating of the seed, seed holder and rod. This method has been adopted as the most relevant prior art.

Said method suffers from a number of essential disadvantages which do not allow its use for a considerable range of materials grown by Czochralski or Kiropulos methods:
1. The method cannot be used for decomposable materials, e.g., $A_3B_5$, in which the vapor pressure of one of the components at $T_{melt}$ reaches 40 atm and over.
2. The method cannot be used for vaporable materials, e.g., $A_2B_6$, in which the vapor pressure of both components reaches 3 atm and over at $T_{melt}$ of the compounds.
3. The method cannot be used for a number of materials having a high plasticity at $T_{melt}$, because there takes place plastic deformation of the growing crystal as such under its own weight (e.g., $\alpha$-$Al_2O_3$), when plastic deformation is observed already at the temperature of 1600° C.
4. The method cannot be used for a number of materials having small values of melt overcooling (for instance, for CdTe $\Delta T_{over} \cong 1°$ C.), when fluctuations of the heater temperature as small as ±0.5° C. lead either to melting of the seed crystal or to spontaneous crystallization of the melt in the crucible.
5. The method cannot be used for a number of materials in which the emissivity factor of the melt and of the crystal, as well as the absorption of IR rays from the heater are close, e.g., in the case of Ge, Si, InSb, etc.
6. The difference and amount of dark heat passed through the melt and the crystal are incommensurably smaller than the evolving crystallization heat. For example, $\alpha$-$Al_2O_3$=255 cal/g, therefore the method can be realized only at very small crystallization rates, i.e., it is industrially inapplicable.

The technical result of the claimed invention is its universality with regard to the material of the single crystal to be grown, enhanced performance, and improved structural finish of resulting single crystals by ruling out melt overcooling in the coursed of growing.

The technical result is attained by that in the method of growing single crystals from melt, which comprises fusing the starting material and pulling a single crystal by crystallization of the melt on a seed crystal with controlled removal of the crystallization heat and using independent heating sources constituting thermal zones, according to the invention, independent heating sources constitute two equal-sized coaxially arranged thermal zones, which make up a united thermal area for the melt and the single crystal being grown and are separated by the melt surface, fusing of the starting material being carried out in two stages: first by heating the upper thermal zone with supplying to the upper heater 30-50% of power required for obtaining the melt, until in the upper thermal zone maximum temperature is reached, which secures stable state of the solid phase of the seed crystal; then the remaining power is supplied to the lower thermal zone to the lower heater with maintaining constant temperature of the upper thermal zone till complete melting of the charge; the process of the single crystal enlargement and growing is conducted with controlled lowering of temperature in the upper thermal zone, the amount of power supplied to the lower thermal zone being preserved constant.

Besides, the removal of crystallization heat in the stage of single crystal enlargement and growing is carried out with the rate of single crystal crystallization, calculated from the formula:

$$\frac{\Delta m}{\Delta \tau} = \left[\frac{\delta(T_{melt} - T_{crit} \pm \Delta T)}{\delta h}\right]_p \times \frac{\lambda \pi (R \pm \Delta T / A)^2}{\Delta H_{fus} + C_p \Delta T}, \quad (1)$$

g/sec, where
- $\Delta m$ is the weight of the crystal, g;
- $\Delta \tau$ is the time of weight increment ($\Delta m$), sec;
- $T_{melt}$ is the melting temperature of the starting material, deg.;
- $T_{crit}$ is the maximum temperature of the stable state of the solid phase of the seed crystal, deg.;
- $\Delta T$ is the temperature variation on the upper heater during the process, deg.;
- $\Delta H_{melt}$ is the specific heat of melting, cal/g;
- p is the pressure, const.;
- R is the radius of the crystal, cm;

$$A = \frac{\Delta T}{\Delta R}$$

is the radial temperature gradient at the crystallization front, deg./cm;

$$\frac{\delta(T_{melt} - T_{crit})}{\delta h}$$

is the initial axial temperature gradient in the crystal growing zone, deg./cm;
- $C_p$ is the specific heat of the crystal, cal/g deg.;
- $\lambda$ is the heat conduction of the crystal, cal/cm·sec·deg.

The essence of the invention is as follows. For growing an "ideal" single crystal in terms of its structure, in the known methods it is necessary to find "the golden mean" between the temperature gradient created by t° of the melt and t° in the zone of the growing crystal for removing the crystallization heat.

In RU 2056463, for removing crystallization heat, the crystallization rate is decreased, so as to provide for the heat removal along the crystal at the expense of the heat conduction of the seed material.

Or, else, the power supply to the heater in the zone of the crucible with the melt is decreased, the melt temperature being thereby lowered (RU 2054495).

The use of these techniques has negative aspects. Lowering the crystallization rate sharply reduces the process efficiency. Lowering the melt temperature at the expense of lowering the heating power leads to overcooling the melt at the crystallization front and, as a consequence, to the origination of structural defects (low-angle boundaries, polycrystalline structure).

In the claimed invention the evolving crystallization heat is removed along the crystal by increasing the axial temperature gradient in the zone of growing crystal from its minimal value.

In the present invention a principally novel technique is used for attaining this effect.

In the reaction zone, where the starting material and the seed crystal with a holder and rod are located, two equal-sized thermal zones are created by two independent heaters, these zones being disposed one above the other and constituting a united thermal area. For fusing the starting charge, first the upper thermal zone is heated by supplying to the upper heater a part (30-50%) of the power required for fusing the starting material. Such amount of power makes it possible to heat the upper zone to the maximum temperature which is capable of preserving the seed crystal in practically stable solid-phase state ($T_{crit}$). Thus, for example, for $A_3B_5$ compounds this is practical absence of dissociation, for $A_2B_6$ compounds this is the absence of evaporation, for refractory oxides $\alpha\text{-Al}_2O_3$ this is the absence of plastic deformation. Then the remaining power is supplied to the lower heater for heating the lower thermal zone. The temperature of the upper heater, equal to $T_{crit}$, is maintained constant till complete melting of the starting charge and attaining dynamic equilibrium between the liquid phase (melt) and the solid phase (seed crystal).

The dynamic equilibrium having been reached, stabilization of the power of the lower heater is effected.

The temperature difference between $T_{melt}$ of the melt and $T_{crit}$ creates minimal axial gradients above the melt and in the melt in the united thermal area constituted by the upper and lower thermal zones. The enlargement and growing of the single crystal are carried out with varying the axial temperature gradient above the melt by lowering the power supplied to the upper heater and thereby lowering the temperature of the upper thermal zone. Such temperature lowering is effected while the power supplied to the lower heater remains preserved.

Growing of the crystal is achieved owing to the removal the crystallization heat, performed by increasing the temperature gradient above the melt by lowering the temperature of the upper heater. The crystallization rate (g/sec.) is calculated from formula (1).

As the temperature of the upper heater lowers and the temperature of the upper thermal zone lowers accordingly, the axial temperature gradient increases, and the crystal grows.

Concurrently therewith, the amount of power supplied to the lower heater being preserved throughout the process of growing there takes place lowering of the crystal-melt temperature from the more heated body to the less heated body according to the scheme: lower heater→crucible→melt periphery→melt centers→crystal→upper heater.

The temperature of the melt lowers via the crystallization zone in proportion with the lowering of the temperature of the upper heater, precluding the melt overcooling at the crystallization front. Therefore the crystal being grown always grows only toward the area of the more heated melt, the heat removal always goes through the center of the melt in the direction of the growing crystal.

In all the known methods lowering of the crystal-melt temperature goes in an opposite direction.

Carrying out the process by the claimed techniques ensures the absence of low-angle boundaries in the grown crystals and a low dislocation density. Further, it is very important that the process efficiency grows in proportion to the lowering of the temperature of the upper heater, since overcooling of the melt is absent till the moment the upper heater is switched off.

The claimed techniques characterize a fundamentally new single crystal growing technology, according to which single crystals are obtained not from "overcooled" melts but from "superheated" melts, because the heat flow always goes along the above-described pathway.

The united thermal area constituted by the equal-sized thermal zones disposed one above the other and separated by the melt surface comprises the zone of the crucible zoned and the zone of the to-be crystal. Melting of the charge is effected by the total supply of power to both thermal zones in such a manner that lowering of the power supplied to one of the thermal zones should lead to the crystallization of the melt in the crucible. Creation of the united thermal area determines the creation of united axial and radial temperature gradients minimum possible for a particular material. Since in the course of crystal enlargement and, growth variation of the temperature gradients does not lead to overcooling of the melt, the method makes it possible to grow single crystals in which the proper value of the melt overcooling temperature can be within the range of from 70° C. to ~0° C.

Furthermore, the creation of the united thermal area constituted by the equal-sized thermal zones makes it possible to cool the grown crystal down to room temperature under isothermal conditions by leveling the temperatures in the thermal zones by way of simultaneous lowering of power of the upper and lower heaters.

Since in carrying out the method overcooling of the melt at the crystallization front is absent, using this method it is possible to grow single crystals from materials in which the faculty of the melt for overcooling is close to zero and which up till now could not be grown by the Czochralski method (CdTe, $\alpha$-$Al_2O_3$ in the direction [0001]; GaAs in the direction [001] or had definite structural variances.

EXEMPLARY EMBODIMENT OF THE METHOD

Power is supplied to the resistance heater disposed above the crucible with a charge, and the temperature is brought close to T critical for the given crystallizing material.

Critical temperatures for materials are such temperatures, at which there occur irreversible and uncontrolled processes on the surface of the solid phase of the crystal: processes of dissociation, evaporation, plastic deformation, etc., when further practical application of the crystallization process makes no sense. Thus, for instance, the temperature at which there is observed noticeable dissociation of growing GaP crystal above the flux is ~1300° C. when $T_{melt}$=1467° C.; the temperature at which there is observed noticeable evaporation of growing CdTe crystal above the flux is ~700° C. when $T_{melt}$=1092° C.; the temperature at which there is observed noticeable plastic deformation of growing $\alpha$-$Al_2O_3$ crystal is ~1600° C., and plastic deformation of Si crystal is >1100° C. when $T_{melt}$=1420° C., etc.

After the temperature of the upper resistance heater becomes close to critical, stabilization of the temperature of the upper thermal zone is carried out. The temperature sensing unit is a thermocouple mounted in the upper part of the upper heater for minimizing the influence of the lower resistance heater on the thermocouple readings.

After the entire mass of the inner outfit of the furnace is heated, power is supplied to the lower heater which serves for fusing the charge in the crucible. The temperature of the upper heater remains constant and equal to $\leq T_{crit}$. As the charge becomes gradually melted and the melt temperature stabilized, a critical (minimal) axial temperature gradient or the given material is created automatically. Then seeding is carried out. As stable dynamic equilibrium is reached gradually between the solid phase (the seed crystal) and the liquid phase (the melt) (the presence of a constant bright halo around the seed), the temperature of the upper heater is lowered, thereby increasing the axial, and, consequently, the radial temperature gradients of the seed crystal and of the melt, respectively, with the power of the lower heater stabilized.

In this way conditions are created, under which the crystal grows from the superheated melt. The areas of melt overheating at the crystallization front are absent throughout the process of crystallization. Since the crystal grows continuously from the "superheated" but not from the "overcooled" melt, this makes it possible not only to eliminate the undesirable formation of structural defects on the crystallization front, but gives an opportunity to obtain by Czochralski method such materials which could not be produced or were difficult to produce heretofore, e.g., CdTe, GaAs single crystals in the [100] orientation, $Al_2O_3$ in the [0001] orientation, and the like.

When the whole melt has crystallized in the form of crystal grown on the seed, the temperature of the lower heater is lowered down to the temperature of the upper heater, and then the power values of the heaters are lowered synchronously till room temperature is reached, isothermal conditions being thus created for removing residual thermal stresses within the entire bulk of the single crystal.

So, when growing an $\alpha$-$Al_2O_3$ single crystal from a "superheated" melt, after preparing the smelting chamber for the process (loading the charge, mounting round-shaped or profiled heaters, mounting an appropriate seed crystal, oriented in accordance with the heater profile, degassing and creating a definite atmosphere in the smelting chamber, and other operations), the upper heater is switched on and brought to a temperature according to the thermocouple in the range of $T_{crit}$~1600° C. $T_{crit}$ having been reached, all the outfit in the smelting chamber is heated for several hours till the heat exchange becomes stable. Then the lower heater is switched on, its power is adjusted to bring the heater to the temperature equal to $T_{melt}$ $Al_2O_3$=2050° C. and maintained to the stable state which is determined visually from the behavior of the melt surface. By manipulating the power of the lower heater, seeding is carried out. The stable state of the system is determined from a stable halo around the seed crystal on the liquid-solid phase interface. After the dynamic equilibrium is reached, stabilization of the power of the lower heater is carried out, and stability is preserved throughout the crystallization process. By lowering the temperature in accordance with the thermocouple readings with an accuracy of ±0.5° C. enlargement of the crystal is carried out. Removal of the crystallization heat occurs along the crystal as a result of the temperature gradient increasing with time.

Since the lower heater is power-stabilized, the temperature of the crucible with the melt will also lower accordingly, but it will always remain higher than $T_{melt}$, i.e., the melt at the crystallization front is always "superheated". Maintaining the diameter of the growing crystal is accomplished in accordance with the increment of its weight per unit of time, i.e., in accordance with the crystallization rate which is precalculated from relation (1), and downloaded into the program. On completion of the single crystal growing process, the power of the lower heater is lowered down to leveling the temperatures in the crucible and in the zone of the grown single crystal. The crystal is cooled to room temperature under isothermal conditions by simultaneous lowering of the power values of the two heaters.

An example of particular embodiment of the method:

The meaning of the formula $\Delta m/\Delta \tau$—as mentioned and already referred to above—consists in the determination of the temperature conditions for growing single crystals from "overheated" melts by Amosov method with maximum permissible rates. When using this formula, it should be taken into account that in the process of enlargement the radius of the crystal being grown increases continuously with the course of time: $R1=R_o+\Delta T/A$, $R2=R1+\Delta T/A$, etc.

As the radius of the crystal increases, approaching the radius of the crucible (the stage of completion of the enlargement), owing to an increase of the radial gradient at the walls of the crucible $\Delta T/A \to 0$, and further lowering of the temperature on the upper heater practically does not lead to an increase of the crystal radius. The crystal continues growing owing to an increase of the axial temperature gradient along the crystal.

Starting parameters:
Material: corundum ($\alpha$-$Al_2O_3$);
$T_{melt}=2050°$ C.;
$T_{crit} \sim 1660°$ C. at point h=20 cm from the melt surface;
$\lambda \sim 0.008$ cal/cm·sec·deg.;
$R_o=0.5$ cm (the radius of the seed crystal);

$$A = \frac{\Delta T}{\Delta R} \sim 10° \text{ C./cm;}$$

$\Delta H_{melt}=255$ cal/g;
$C_p=0.3$ cal/g·deg.

We substitute these values into formula (1) of the crystallization rate ($\Delta m/\Delta \tau$). Then we set the lowering of the temperature of the upper heater, e.g., $\Delta T=-5°$ C. In the stage of enlargement the increment of the crystal weight will be $\Delta m/\Delta T=8.02$ g/hr.

The process of the crystal enlargement is continued by further lowering of the temperature of the upper heater till a prescribed diameter of the crystal, e.g., 120 mm, is obtained.

The process of growing is carried out at a constant value of the crystal weight increment per unit of time and with lowering the temperature of the upper heater. With the diameter of the crystal being grown 120 mm, $\Delta m/\Delta \tau$ is 1149 g/hr.

The process of growing a 30 kg crystal lasts for ~26 hours. Thermal stresses, low-angle boundaries and structural defects are completely absent in the grown crystal.

So, the claimed method makes it possible to grow with a high efficiency bulky single crystals without limitations as to their chemical composition and noted for a perfect structure.

The invention claimed is:

1. A method for producing single crystals by growing from melt, which comprises fusing a starting material and pulling a single crystal by crystallization of a melt on a seed crystal with controlled removal of crystallization heat and with using independent heat sources which constitute thermal zones, wherein the independent heat sources constitute two equal-sized coaxially arranged thermal zones which make up a united thermal area for the melt and the single crystal being grown, said zones being separated by the melt surface, fusing of the starting material being carried out in two stages: first by heating the upper thermal zone with supplying to an upper heater 30-50% of power required for obtaining the melt, until in the upper thermal zone maximum temperature is reached, which secures stable state of the solid phase of the seed crystal; then the remaining power is supplied to the lower thermal zone to a lower heater with maintaining constant temperature of the upper thermal zone till complete melting of a charge; the process of the single crystal enlargement and growing is conducted with controlled lowering of temperature in the upper thermal zone, the amount of power supplied to the lower thermal zone being preserved constant.

2. The method according to claim 1, wherein the removal of crystallization heat in the stage of single crystal enlargement and growing is carried out with the crystallization rate calculated from the formula:

$$\frac{\Delta m}{\Delta \tau} = \left[ \frac{\delta(T_{melt} - T_{crit} \pm \Delta T)}{\delta h} \right]_p \times \frac{\lambda \pi (R \pm \Delta T/A)^2}{\Delta H_{fus} + C_p \Delta T}, \quad (1)$$

g/sec, where
$\Delta m$ is the weight of the crystal, g;
$\Delta t$ is the time of weight increment ($\Delta m$), sec;
Tmelt is the melting temperature of the starting material, deg.;
Tcrit is the maximum temperature of the stable state of the solid phase of the seed crystal, deg.;
$\Delta T$ is the temperature variation on the upper heater during the process, deg.;
$\Delta H$melt is the specific heat of melting, cal/g;
p is the pressure, const.;
R is the radius of the crystal, cm;

$$A = \frac{\Delta T}{\Delta R}$$

is the radial temperature gradient at the crystallization front, deg./cm;

$$\frac{\delta(T_{melt} - T_{crit})}{\delta h}$$

is the initial axial temperature gradient in the crystal growing zone, deg./cm;
Cp is the specific heat of the crystal, cal/gdeg.;
$\lambda$ is the heat conduction of the crystal, cal/cmsecdeg.

* * * * *